(12) United States Patent
Fukuda (10) Patent No.: US 8,710,674 B2
(45) Date of Patent: Apr. 29, 2014

(54) INTERNAL WIRING STRUCTURE OF SEMICONDUCTOR DEVICE

(71) Applicant: Fuji Electric Co., Ltd., Kawasaki (JP)

(72) Inventor: Kyohei Fukuda, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/855,830

(22) Filed: Apr. 3, 2013

(65) Prior Publication Data

US 2013/0277849 A1    Oct. 24, 2013

Related U.S. Application Data

(63) Continuation of application No. PCT/JP2012/051527, filed on Jan. 25, 2012.

(30) Foreign Application Priority Data

Feb. 17, 2011 (JP) .................................. 2011-031838

(51) Int. Cl.
*H01L 29/40* (2006.01)
*H01L 23/52* (2006.01)
*H01L 23/48* (2006.01)

(52) U.S. Cl.
USPC ........... 257/774; 257/773; 257/776; 257/784; 257/786

(58) Field of Classification Search
USPC .......................... 257/773, 774, 776, 784, 786
See application file for complete search history.

(56) References Cited

U.S. PATENT DOCUMENTS

| 6,262,474 | B1 | 7/2001 | Kobayashi et al. |
| 7,227,240 | B2 * | 6/2007 | Knapp et al. .................. 257/531 |
| 2005/0121783 | A1 | 6/2005 | Murakami |

FOREIGN PATENT DOCUMENTS

| JP | 05-021674 A | 1/1993 |
| JP | 05-120928 A | 5/1993 |
| JP | 07-249735 A | 9/1995 |
| JP | 08-019267 A | 1/1996 |
| JP | 11-345926 A | 12/1999 |
| JP | 2005-166983 A | 6/2005 |
| JP | 2006-060986 A | 3/2006 |
| JP | 2009-064852 A | 3/2009 |

* cited by examiner

*Primary Examiner* — George Fourson, III
*Assistant Examiner* — Wilner Jean Baptiste
(74) *Attorney, Agent, or Firm* — Rossi, Kimms & McDowell, LLP (57) ABSTRACT

Aspects of the invention provide an internal wiring structure of a power semiconductor device, which is capable of reducing a mutual inductance between two wiring conductors and improving the heat dissipation effect, the two wiring conductors being disposed so as to oppose each other and having currents flowing in the same direction. In some aspects, notches can be formed alternately from side walls of two flat plates, on the flat plates, to obtain two wiring conductors. The two wiring conductors can be disposed so as to oppose each other and in parallel to each other so that currents flow along the notches in directions opposite to each other. Accordingly, in some circumstances, the mutual inductance can be reduced. Further, in some circumstances, the dimensions of the planes of the wiring conductors obtained by forming the notches can be increased to improve the heat dissipation.

4 Claims, 12 Drawing Sheets

INTERNAL WIRING STRUCTURE OF SEMICONDUCTOR DEVICE

CROSS-REFERENCE TO RELATED APPLICATIONS

This application is a continuation of International Application No. PCT/JP2012/051527, filed on Jan. 25, 2012, which is based on and claims priority to Japanese Patent Application No. JP 2011-031838, filed on Feb. 17, 2011. The disclosure of the Japanese priority application and the PCT application in their entirety, including the drawings, claims, and the specification thereof, are incorporated herein by reference.

BACKGROUND

1. Field of the Invention

Embodiments of the invention relate to internal wiring structures of semiconductor devices such as, but not limited to, power semiconductor modules.

2. Related Art

Figure 8:
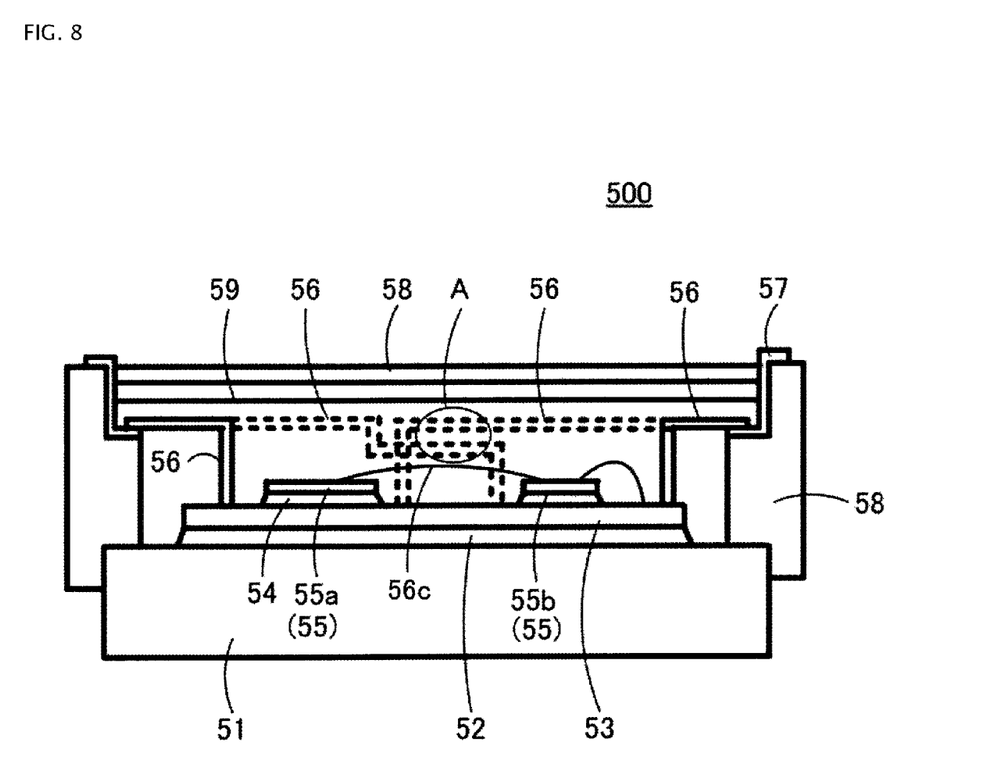
FIG. 8 is a substantial cross-sectional view schematically showing a conventional power semiconductor module.

FIG. 8 is a substantial cross-sectional view schematically showing a conventional power semiconductor module. This power semiconductor module 500 configures a three-phase inverter circuit in which six semiconductor chips 55 made up of IGBT chips 55a and FWD chips 55b are stored in a resin case. FIG. 8 is a substantial cross-sectional view that schematically shows one of the IGBT chips 55a and one of the FWD chips 55b. The IGBT chip 55a and the FWD chip 55b are connected to each other by bonding wires 56c. A flat plate such as a copper plate, for example, is used as each wiring conductor 56 that connects a conductive pattern of an insulating substrate 53 with a conductive pattern and an external lead terminal 57 to each other. The detail of this configuration is described hereinafter.

This power semiconductor module 500 includes a heat dissipation base 51, the insulating substrate 53 with a conductive pattern, a rear conductive film of which adheres to the heat dissipation base 51 via a solder 52, and the semiconductor chips 55 such as the IGBT chip 55a and the FWD chip 55b adhering to a front conductive pattern of the insulating substrate 53 with a conductive pattern via a solder 54.

The power semiconductor module 500 also includes the bonding wires 56c that connect the semiconductor chips 55 to each other, the bonding wires 56c that connect the semiconductor chips 55 and the conductive patterns to each other, the wiring conductors 56 having one end adhering to the conductive pattern of the insulating substrate 53 with a conductive pattern, the external lead terminal 57 to which the other end of the wiring conductors 56 is connected, a resin case 58 to which the external lead terminal 57 adheres and which adheres to an outer circumference of the heat dissipation base 51, and gel 59 for filling the resin case 58.

Due to the three-phase inverter circuit configured in the power semiconductor module 500, the wiring conductors 56 are disposed inside the resin case 58, in the form of flat plates, such as copper plates, with a P-terminal wire, an N-terminal wire, a U-terminal wire, a V-terminal wire, and a W-terminal wire.

In the internal wiring structure of the power semiconductor module 500, the copper plates configuring the wiring conductors 56 having the above-mentioned terminal wires are disposed so as to partially oppose each other and be partially parallel to each other. Thus, in some sections of the wiring conductors 56, currents flow in the same direction (e.g., a section A).

Figure 9:
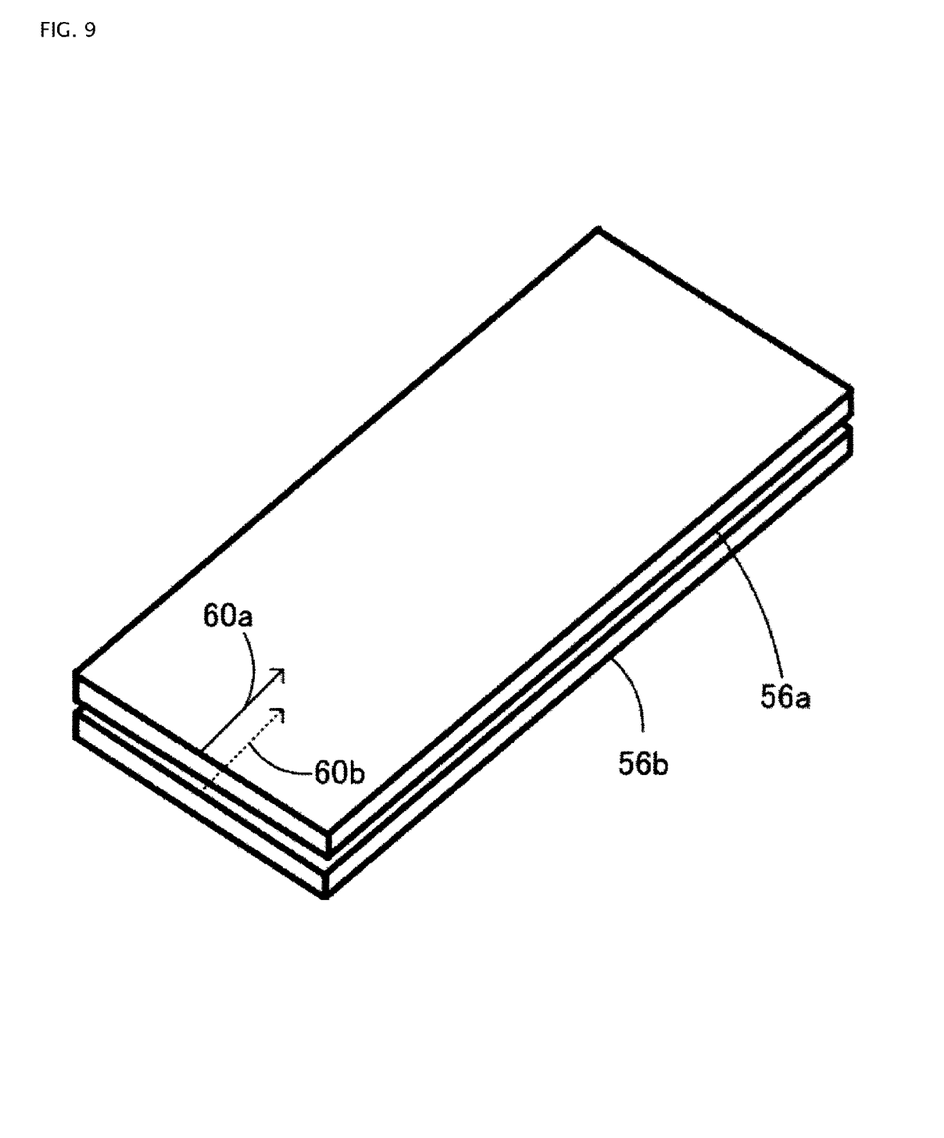
FIG. 9 is a substantial perspective view showing a section in which two wiring conductors are disposed so as to oppose each other and in parallel to each other and in which currents flow therein in the same direction.

FIG. 9 is a substantial perspective view showing the section (section A) with first and second wiring conductors 56a and 56b where a current 60a (solid arrow) and a current 60b (dashed arrow) flow in the same direction, the first and second wiring conductors 56a and 56b being disposed so as to oppose each other and in parallel to each other. A wiring inductance L of the first and second wiring conductors 56a and 56b at this section is a sum of a self inductance Ls and a mutual inductance M; L=Ls±M. The symbol "+" means that the directions of the currents flowing in the parallel wiring conductors 56a, 56b are the same, whereas the symbol "−" means that the directions of the currents are opposite to each other.

$$Ls=(\mu T/2\pi)\times(\log(2T/a)-(3/4))$$

$$M=(\mu T/2\pi)\times(\log(2T/d)-(3/4))$$

where "T" represents the length of the wiring conductors, "a" the radius of the wiring conductors (when the wiring conductors have a circular cross-section) (in FIG. 9, the radius is obtained by converting the cross-sectional area to equivalent round), "μ" the magnetic permeability of the wiring conductors, and "d" the distance between central axes of the wiring conductors.

In the section described above, the mutual inductance M increases, and the wiring inductance L of the wiring conductors 56a, 56b also increases.

In addition, in Japanese Patent Application Publication No. 2006-60986 (also referred to herein as "Patent Document 1"), a slit (notch) is formed on a side surface of a conventional single straight wiring conductor to allow the current flowing through the single wiring conductor to meander through, so that a high-frequency resistance of the single wiring conductor increases, further reducing radiation noise. With this structure, radiation noise caused by a switching operation of a semiconductor element (semiconductor chip) such as an IGBT can be reduced without particularly increasing the size of a circuit or a device. Another example where a skin effect is used in place of the slit is described in Patent Document 1.

Patent Document 1 describes that the formation of a slit for reversing the direction of the current flowing through the single wiring conductor can reduce the radiation noise.

Figure 10:
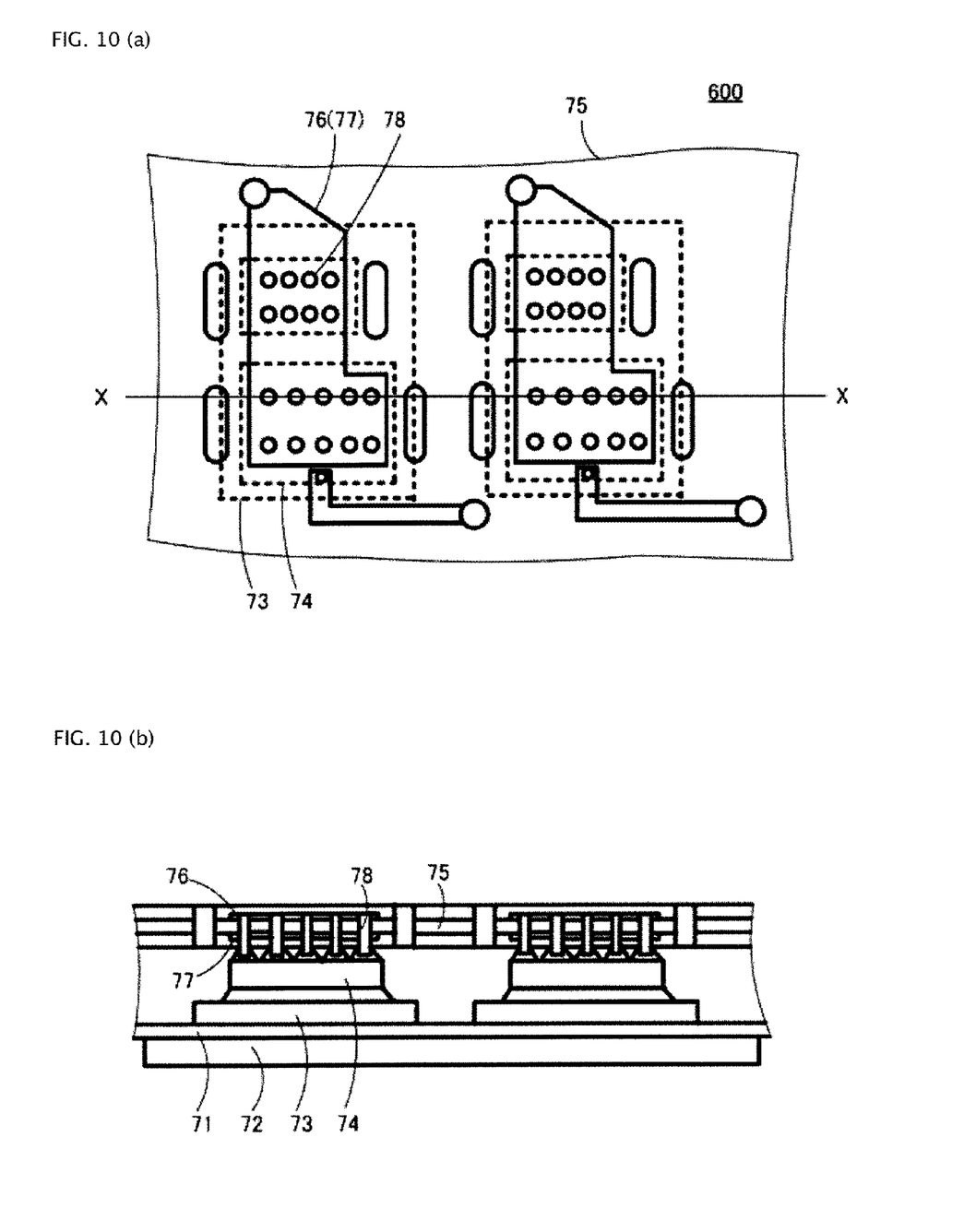

Japanese Patent Application Publication No. 2009-64852 (also referred to herein as "Patent Document 2") discloses a power semiconductor module 600 shown in FIG. 10 in which a rear conductive film 72 made from a metal foil is formed on a first main surface of an insulating plate 71 and at least one conductive pattern 73 made from another metal foil is formed on a second main surface of the insulating plate 71. Furthermore, the power semiconductor module 600 has a printed board 75 that is disposed so as to face (at least one) semiconductor chip 74, which is a semiconductor element bonded onto the latter metal foil, and so as to face a main surface of the insulating plate 71 in which the semiconductor element is disposed. A wiring conductor 76, which is a metal foil formed on a first main surface (front side) of the printed board 75, or another wiring conductor 77, which is a metal foil formed on a second main surface (rear side) of the printed board 75, is electrically connected to a main electrode of the semiconductor element by a plurality of post electrodes 78. The wiring conductors 76, 77 are configured as two layers of metal foils in which currents flow in the same direction. According to Patent Document 2, having such a configuration, a semiconductor device that provides high contact reliability, excellent operating characteristics, and high productivity can be realized.

In the configuration described above, currents constantly flow in the same direction in the wiring conductors 76, 77 which are the metal foils having the printed board 75 therebetween.

When the semiconductor chips 55, 74 are turned ON/OFF with the increased wiring inductance L described above, a large surge voltage (−L (di/dt)) is applied to the semiconductor chips 55, 74, causing damage to the semiconductor chips 55, 74, increasing magnetic noise, and causing other errors. In addition, high switching loss is produced, increasing the amount of heat generated in the semiconductor chips 55, 74.

Figure 11:
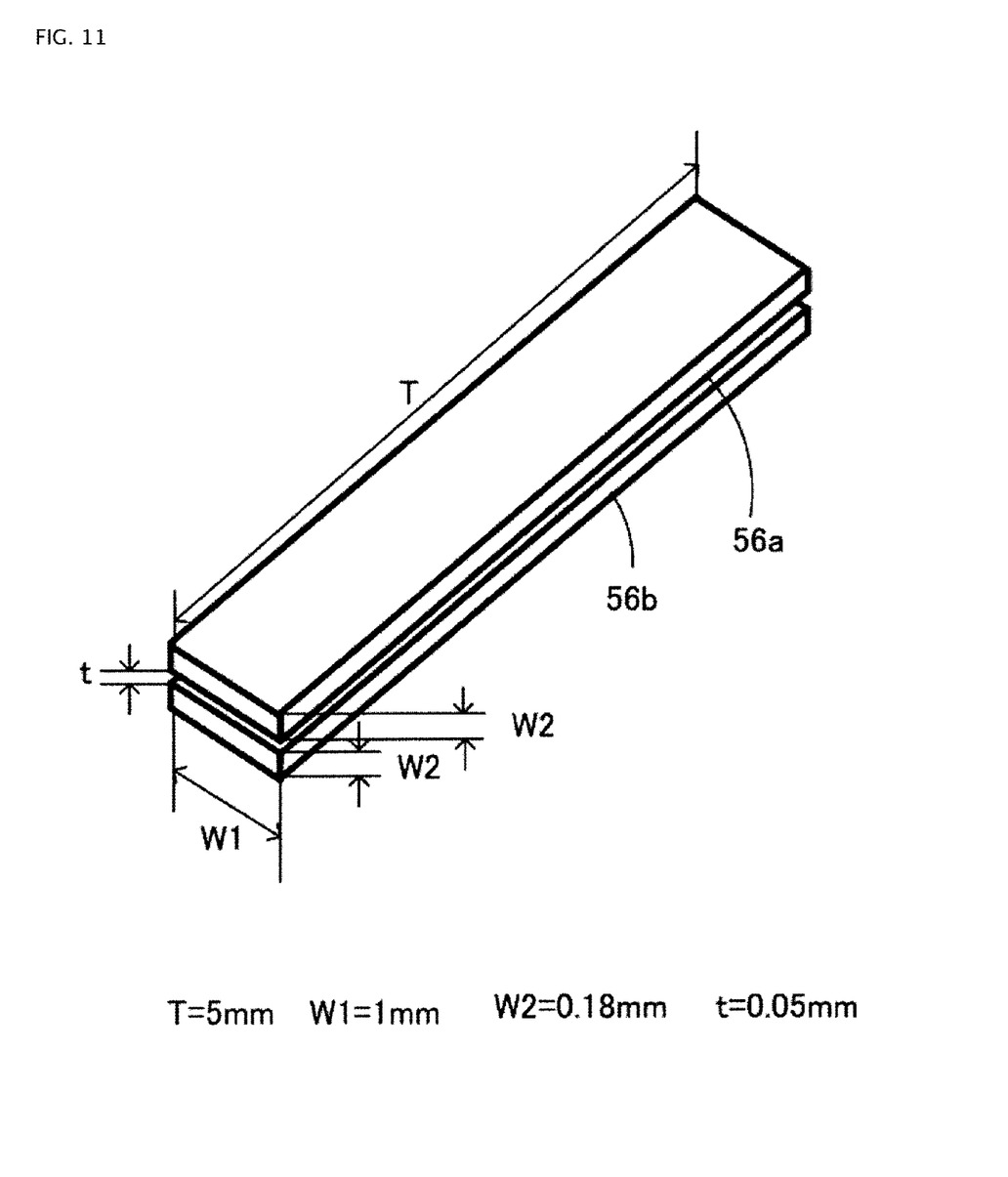
FIG. 11 is a perspective view schematically showing two wiring conductors that are disposed so as to oppose each other and in parallel to each other.
Figure 12:
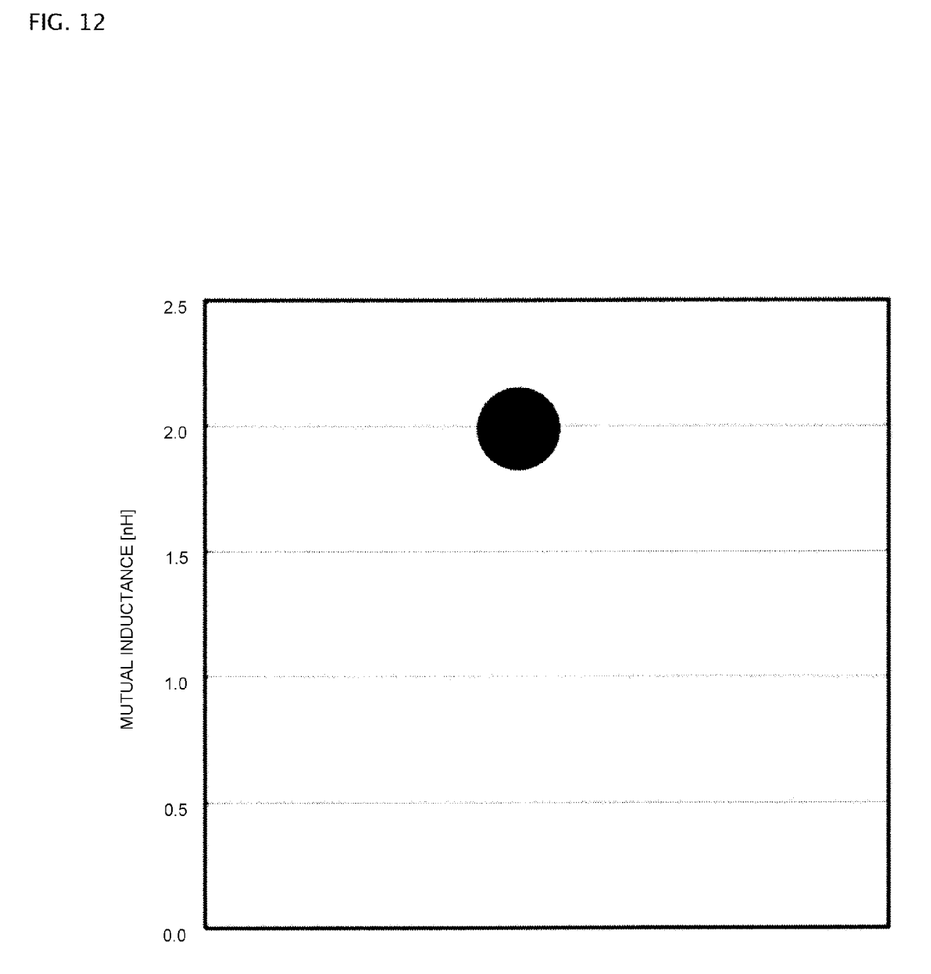
FIG. 12 is a diagram showing a value of a mutual inductance of a conventional internal wiring structure.

FIG. 11 is a schematic perspective view of two wiring conductors that are disposed so as to oppose each other and in parallel to each other. For example, when the wiring conductors 56a, 56b has a length T of 5 mm, a width W1 of 1 mm, a thickness W2 of 0.18 mm, a gap t of 0.05 mm, the mutual inductance M becomes as high as 2.0 nH, as shown in FIG. 12.

In Patent Document 2 mentioned above, the mutual inductance M is high because the wiring conductor 76, which is a metal foil formed on the first main surface of the printed board 75, and the wiring conductor 77, which is another metal foil formed on the second main surface of the printed board 75, are disposed so as to closely oppose each other and the currents flow in the same direction. Patent Document 2 describes that the mutual inductance M can be lowered by tangling the wiring conductors 76, 77 as shown in FIG. 18 of Patent Document 2, the wiring conductors 76, 77 being metal foils that are disposed so as to oppose each other vertically.

Thus, as described above, there are certain limitations in the related art.

SUMMARY OF THE INVENTION

Embodiments of the invention address these limitations, and other needs. Embodiments of the invention provide an internal wiring structure of a power semiconductor device, which is capable of reducing a mutual inductance between two wiring conductors and improving the heat dissipation effect, the two wiring conductors being disposed so as to oppose each other and having currents flowing in the same direction.

Some embodiments include, an internal wiring structure of a semiconductor device that has a first wiring conductor and a second wiring conductor that are disposed so as to oppose each other and in parallel to each other in a case and have currents flowing in the same direction from an input part to an output part, wherein: the first wiring conductor and the second wiring conductor are formed from flat plates; in the first wiring conductor, first notches are formed alternately along a plurality of straight lines extending parallel from one of opposing side walls to the other side wall, in such a manner as to stretch, beyond first central points between the side walls, from one of the side walls to the other side wall and vice versa; in the second wiring conductor, second notches are formed alternately immediately below the plurality of straight lines, in such a manner as to stretch, beyond second central points between side walls, from one of the side walls to the other side wall and vice versa, the one side wall being positioned on a side opposite to the side wall having the first notches; and a length of the first notches is equal to that of the second notches formed immediately below the first notches, the first central points and the second central points overlap with each other, the first notches and the second notches partially overlap with each other, a direction of the current flowing through the first wiring conductor along the first notches is opposite to a direction of the current flowing through the second wiring conductor along the second notches, and a mutual inductance between the first wiring conductor and the second wiring inductor is thereby reduced.

In some embodiments, the first wiring conductor and the second wiring conductor be formed on a front side and rear side of an insulating plate, respectively.

In some embodiments, the first notches be formed at equal intervals, and that a space between a bottom end part of the first notches and a side wall of the first wiring conductor that faces the bottom end part be equal to the interval of the first notches.

According to some embodiments, the notches are alternately formed on the two flat plates from the side walls thereof to obtain the two wiring conductors. The two wiring conductors are disposed so as to oppose each other and in parallel to each other so as to allow the currents flow in directions opposite to each other along the notches. In this manner, the mutual inductance M can be reduced.

In some embodiments, because the dimensions of the planes of the wiring conductors obtained by forming the notches are increased, heat dissipation can be improved.

The above-described advantages of embodiments of the invention are made apparent in the following descriptions of certain embodiments, with reference to the accompanying drawings.

BRIEF DESCRIPTION OF THE DRAWINGS

FIGS. 2(a)-2(c) are a substantial configuration diagram showing the internal wiring structure of the power semiconductor device according to the first example of an embodiment of the invention, where

FIGS. 3(a) and 3(b) are a configuration diagram of an internal wiring structure of a power semiconductor device according to a second embodiment of the invention, where

FIGS. 6(a) and 6(b) are a configuration diagram of an internal wiring structure of a power semiconductor device according to a third example of an embodiment of the invention, where

FIGS. 7(a) and 7(b) are a configuration diagram of wiring conductors shown in FIGS. 6(a) and 6(b), where

FIGS. 10(a) and 10(b) are a configuration diagram of a power semiconductor module described above in Patent Document 2, where FIG. 10(a) is a substantial plan view, and FIG. 10(b) a substantial cross-sectional view taken along line X-X of FIG. 10(a);

DETAILED DESCRIPTION

Embodiments are described hereinafter using certain examples.

Example 1

Figure 1:
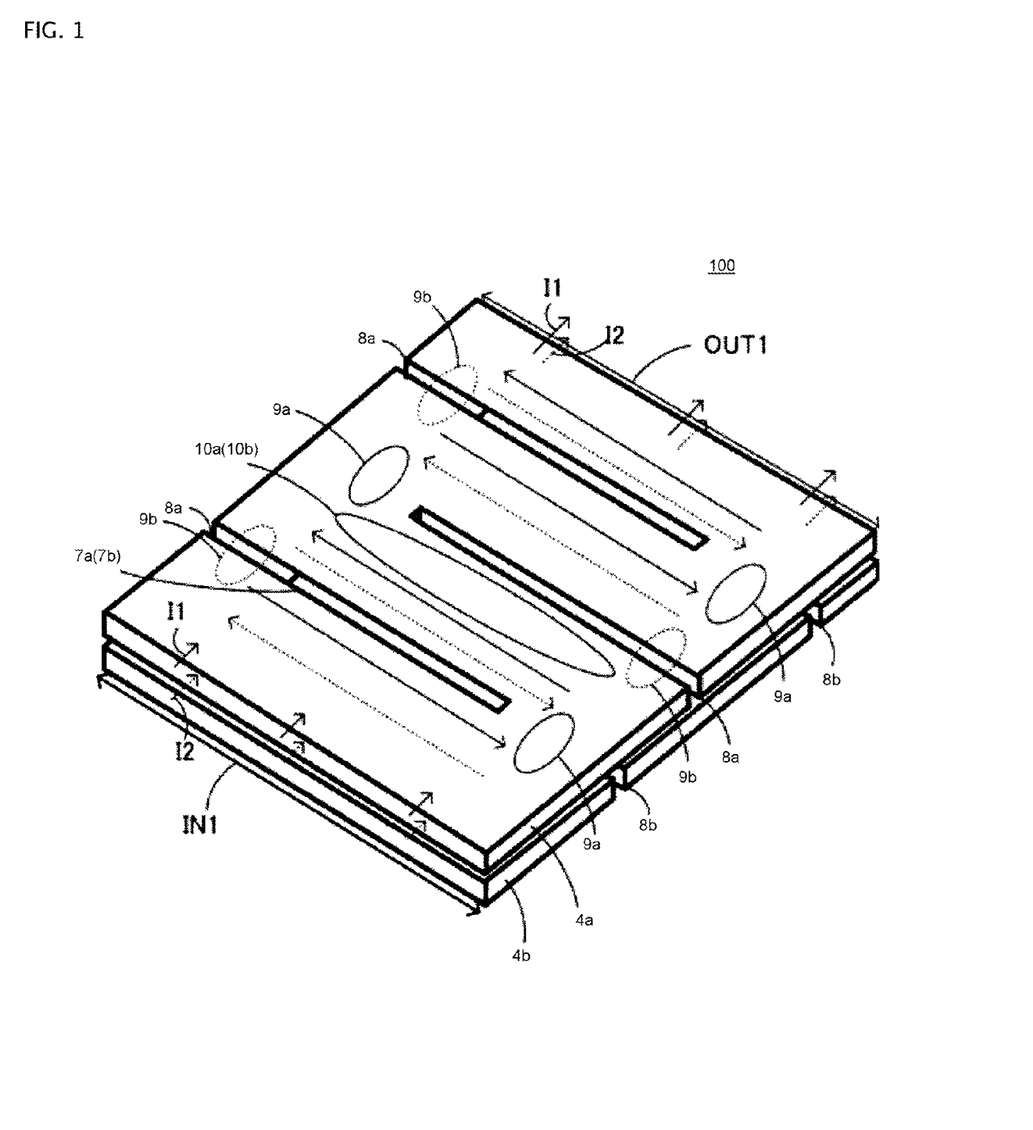
FIG. 1 is a substantial perspective view showing an internal wiring structure of a power semiconductor device according to a first example of an embodiment of the invention.
Figure 2:
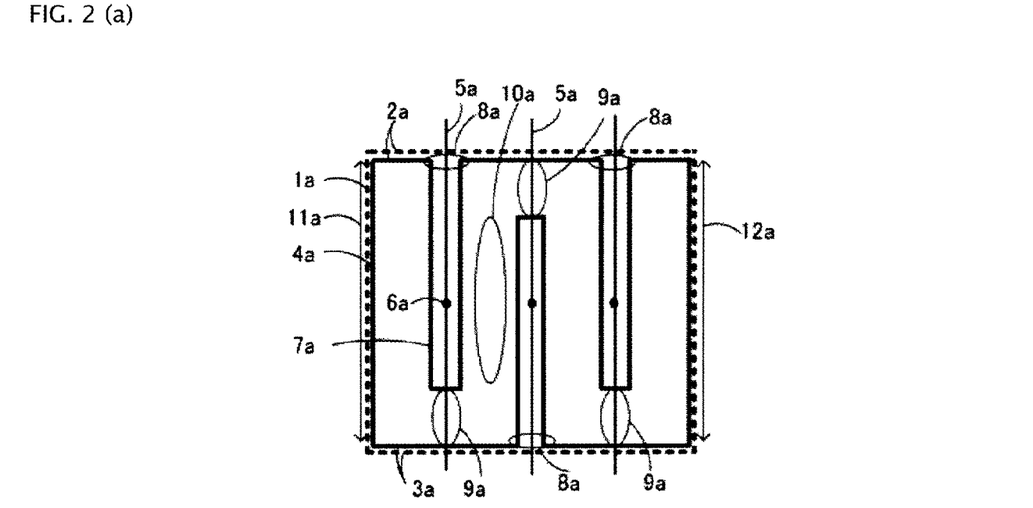
FIG. 2(a) is a substantial plan view of a first wiring conductor.
FIG. 2(b) is a substantial plan view of a second wiring conductor.
FIG. 2(c) is a substantial plan view in which the first wiring conductor and the second wiring conductor are stacked vertically so as to oppose each other and in parallel to each other.

FIGS. 1 and 2(a)-2(c) are each a substantial configuration diagram of an internal wiring structure of a power semiconductor device according to a first example of the present invention. FIG. 1 is a substantial perspective view. FIG. 2(a) is a substantial plan view of a first wiring conductor. FIG. 2(b) is a substantial plan view of a second wiring conductor. FIG. 2(c) is a substantial plan view in which the first wiring conductor and the second wiring conductor are stacked vertically so as to oppose each other and in parallel to each other. The first wiring conductor 4a and the second wiring conductor 4b correspond to the first wiring conductor 56a and the second wiring conductor 56b shown in FIG. 9, respectively. The two wiring conductors 4a, 4b are stacked so as to oppose each other and in parallel to each other. Currents flow into input parts 11a, 11b of the wiring conductors 4a, 4b in the same direction. Currents flow out of output parts 12a, 12b of the wiring conductors 4a, 4b in the same direction. The input part 11a and the input part 11b are combined into an input part IN1. The output part 12a and the output part 12b are combined into an output part OUT1.

The first wiring conductor 4a and the second wiring conductor 4b of this power semiconductor device 100 are formed, respectively, by a first flat plate 1a and a second flat plate 1b having the same outer circumferential shape. In the first wiring conductor 4a, first notches 7a are formed alternately along a plurality of straight lines 5a extending parallel from one of opposing side walls 2a, 3a of the first flat plate 1a to the other side wall, in such a manner as to stretch, beyond central points 6a between the side walls 2a, 3a, from the side wall 2a to the side wall 3a and from the side wall 3a to the side wall 2a.

In the second wiring conductor 4b, second notches 7b are formed alternately along straight lines 5b of the second flat plate 1b on which the straight lines 5a are projected, in such a manner as to stretch, beyond central points 6b, from a side wall 3b to a side wall 2b and from the side wall 2b to the side wall 3b, the side wall 3b being positioned below the side wall 3a that is opposite to the side wall 2a with which the first notches 7a of the first flat plate 1a are in contact.

The length and width of each of the first notches 7a are equal to the length and width of each of the second notches 7b formed immediately below the first notches 7a. The first notches 7a and the second notches 7b are stacked in such a manner as to partially have a gap in the vicinity of the center. The direction of a current I1 flowing in a first section 10a of the first wiring conductor 4a along the first notches 7a is opposite to the direction of a current I2 flowing in a second section 10b of the second wiring conductor 4b along the second notches 7b.

Therefore, a mutual inductance between the first wiring conductor 4a and the second wiring conductor 4b can be reduced.

Note that the currents I1, I2 flow into the input parts 11a, 11b and flow out from the output parts 12a, 12b. Due to the notches 7a, 7b formed in the flat plates 1a, 1b, the currents I1, I2 flow in a meandering fashion. The notches 7a, 7b are in contact with the side walls 2a, 2b at sections 8a, 8b, respectively.

As described above, in the first and second sections 10a and 10b where the currents I1, I2 flow in a meandering fashion, the direction of the current I1 flowing in the first wiring conductor 4a is opposite to the direction of the current I2 flowing in the second wiring conductor 4b. Consequently, the mutual inductance M becomes low.

On the other hand, the currents I1, I2 flow in the same direction in bottoms 9a, 9b of the notches 7a, 7b of the first and second wiring conductors 4a and 4b but are separated from each other. Therefore, the mutual inductance M becomes low in these sections as well.

Note that the first and second flat plates 1a and 1b are normally obtained by cutting a large flat plate.

The first and second wiring conductors 4a and 4b can be formed by means of embossing, without performing the steps of obtaining the first and second flat plates 1a and 1b from a large flat plate.

Example 2

Figure 3:
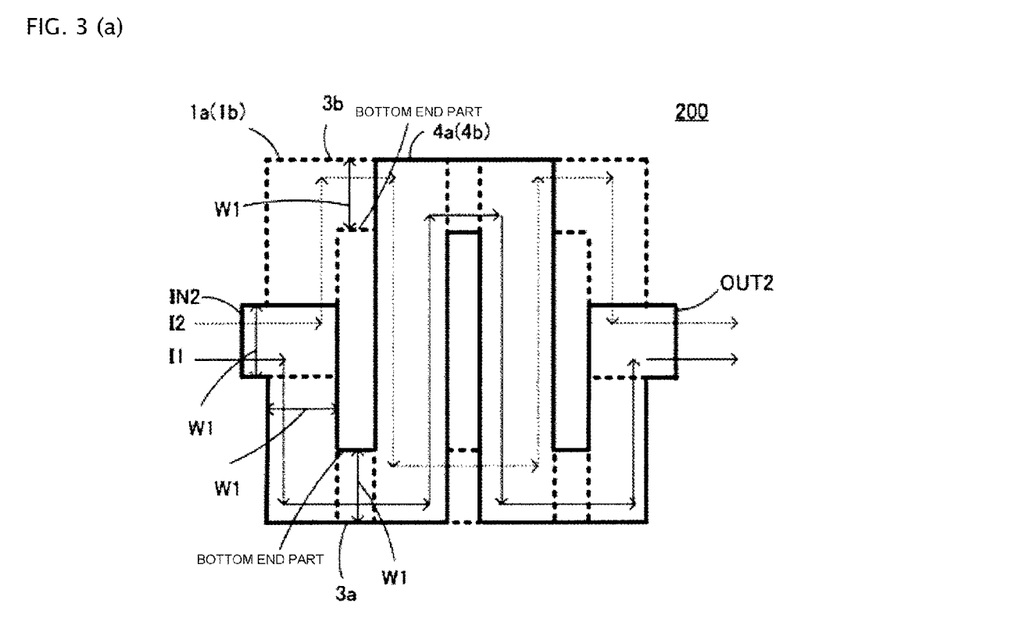
FIG. 3(a) is a substantial plan view.
FIG. 3(b) is a substantial perspective view.

FIGS. 3(a) and 3(b) are a configuration diagram showing an internal wiring structure of a power semiconductor device according to a second example of the present invention. In the diagram, FIG. 3(a) is a substantial plan view, and FIG. 3(b) is a substantial perspective view. The difference between the internal wiring structure of this power semiconductor device 200 and the internal wiring structure of the power semiconductor device 100 shown in FIG. 1 is that the input part IN1 and the output part OUT1 are narrowed to an input part IN2 and an output part OUT2 at the center. This configuration is described hereinafter in detail.

The corners of the first flat plate 1a and the second flat plate 1b shown in FIG. 1 are cut off to narrow the input part IN1 and the output part OUT1 to the center to obtain the input part IN2 and the output part OUT2 shown in FIGS. 3(a) and 3(b). By forming the input part IN2 and the output part OUT2, the mutual inductance M can be made lower in the configuration shown in FIGS. 3(a) and 3(b) than in the configuration shown in FIG. 1, due to the absence of a counter wiring conductor in the vicinity of the input part IN2 and in the vicinity of the output part OUT2. The width of the input part IN2, the width of each of spaces between the notches 7a, 7b, and the width between each bottom end part of the notches 7a, 7b and the side wall 3a of the wiring conductor opposing it are equal to one another. These widths are set at a width W1 of the wiring conductors 4a, 4b.

Note that in the diagram, "T" represents the length of the wiring conductors, "W1" the width of the wiring conductors, "W2" the thickness of the wiring conductors, "t" the gap between the first and second wiring conductors, "S" the width of each notch, "Ts" the length of each notch, and "Ts1" the lengths of sections where the notches overlap with each other.

Figure 4:
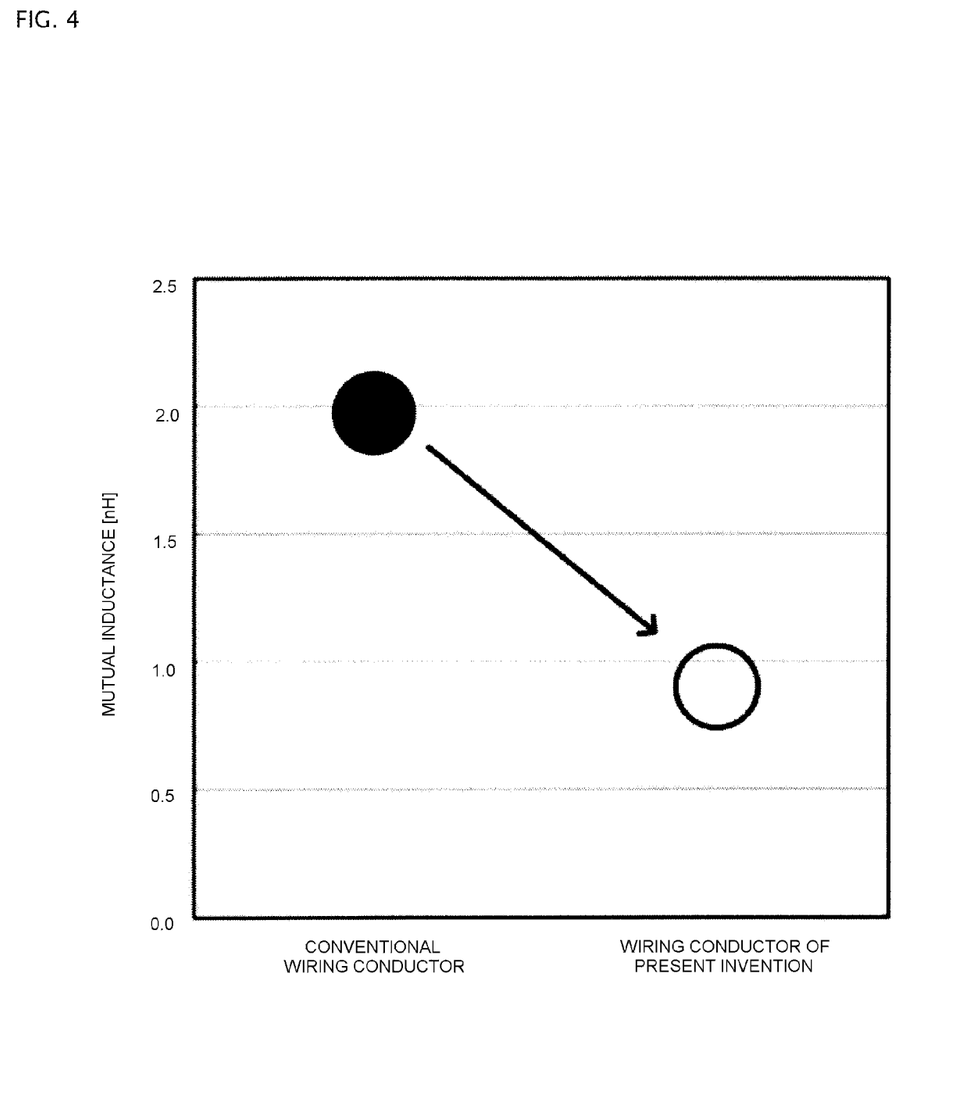
FIG. 4 is a diagram showing results obtained by calculating a mutual inductance between the wiring conductors shown in FIG. 3.

FIG. 4 is a diagram showing results obtained by calculating the mutual inductance between the wiring conductors shown in FIGS. 3(a) and 3(b). For comparison, FIG. 4 shows the calculation results obtained from a conventional flat wiring conductor that does not have any notches.

Figure 5:
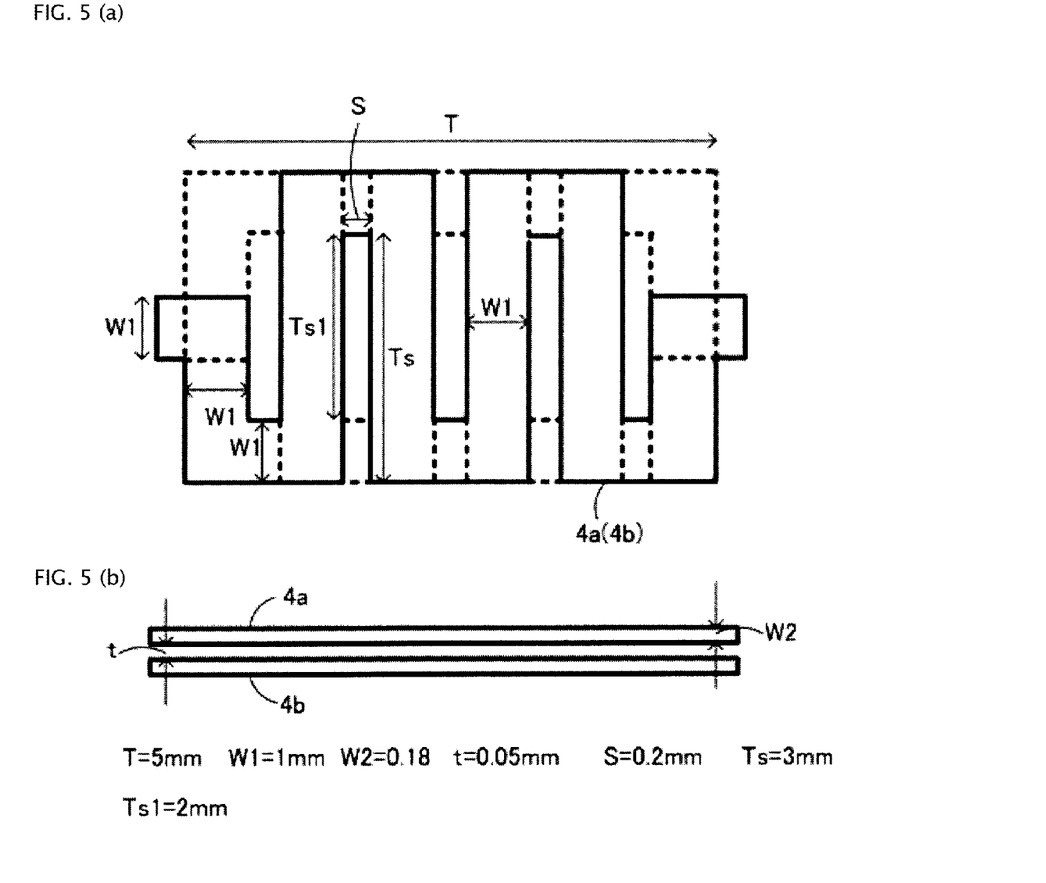
FIGS. 5(a) and 5(b) are diagrams for explaining various elements used for the calculation shown in FIG. 4.

FIGS. 5(a) and 5(b) show various elements used for the calculation. The pattern of the notches shown in FIGS. 5(a) and 5(b) correspond to the pattern of the notches shown in FIG. 4. Steel is used as the material of the wiring conductors. The length T of the wiring conductors is 5 mm, the width W1 is 1 mm, and the thickness W2 is 0.18 mm. The gap t between the wiring conductors opposing each other is 0.05 mm, the width S of each notch 0.2 mm, the length Ts of each notch 3 mm, and the length Ts1 of the sections where the notches overlap with each other, 2 mm.

As is clear from FIG. 4, the mutual inductance between the first wiring conductor 4a and the second wiring conductor 4b having the notches 7a is approximately half the mutual inductance between the flat conventional wiring conductors 56a, 56b with no notches.

By forming the notches 7a, 7b as described above, the directions of the currents I1, I2 flowing along the notches can be made opposite to each other in the first wiring conductor 4a and the second wiring conductor 4b, reducing the mutual inductance M.

When the wiring conductors 4a, 4b need wider dimensions, the mutual inductance M can be reduced more effectively by increasing the length Ts of the notches 7a, 7b and reducing the width S of the notches 7a, 7b.

When applying a current of the same density, the dimensions of the wiring conductors 4a, 4b having the notches 7a, 7b are greater than those of the wiring conductors without notches (flat plate). As a result, improved heat dissipation can be obtained.

The above has described the case in which the outside dimension of the first flat plate 1a forming the first wiring conductor 4a is same as the outside dimension of the second flat plate 1b forming the second wiring conductor 4b. When the outside dimensions are not equal to each other, or, when, for example, the width W1 and the thickness W2 of the wirings are different, the same effects of the present invention can be obtained.

In addition, in the internal wiring structures of the first and second examples, the first and second wiring conductor 4a and 4b of the same shape are rotated 180 degrees and stacked. In the first example, the first wiring conductor 4a and the second wiring conductor 4b are each shaped by bending a belt-like conductor of constant width, 90 degrees into the shape of a letter "W." In the second example, the first wiring conductor 4a and the second wiring conductor 4b are shaped by bending a belt-like conductor having the width W1, 90 degrees into the shape of a letter "a." The entire shapes of the first and second wiring conductors 4a and 4b are in the shapes of flat plates.

The first wiring conductor 4a of the second example is shaped by bending a belt-like conductor having the width W1 so as to be symmetric, wherein a line connecting both ends intersects with the belt-like conductor twice or more. Respective end parts of the belt-like conductor correspond to the input part IN2 and the output part OUT2. Gaps formed between the bent parts of the belt-like conductors correspond to the notches 7a, 7b. The second wiring conductor 4b has the same shape. The second wiring conductor 4b is rotated 180 degrees inward with respect to the first wiring conductor 4a, wherein end parts of the both wiring conductors overlap on each other and are disposed so as to be parallel to each other in the entire belt-like conductors. The end parts of the first wiring conductor 4a and the second wiring conductor 4b are electrically connected to external input/output terminals shared by the wiring conductors.

According to such internal wiring structures, paths in which currents flow in directions opposite to each other are formed in the first wiring conductor 4a and the second wiring conductor 4b. When the tip ends of the notches 7a, 7b that are formed from the side surfaces of the flat plates stretch beyond the central points, which are the points on the lines dividing the flat plates into two parts, or, in other words, when the length Ts of the notches is greater than the width W1, the paths in which the currents flow in the directions opposite to each other becomes long, significantly contributing to a decrease in the mutual inductance. Therefore, the internal wiring structures described above are favorable.

Unlike the second example, in the first example one of the side surface of each belt-like conductor and the other side surface on the opposite side correspond to the input part and the output part. However, the first example is same as the second example in that the paths in which currents flow in the directions opposite to each other are formed in the first wiring conductor 4a and the second wiring conductor 4b.

Example 3

Figure 6:
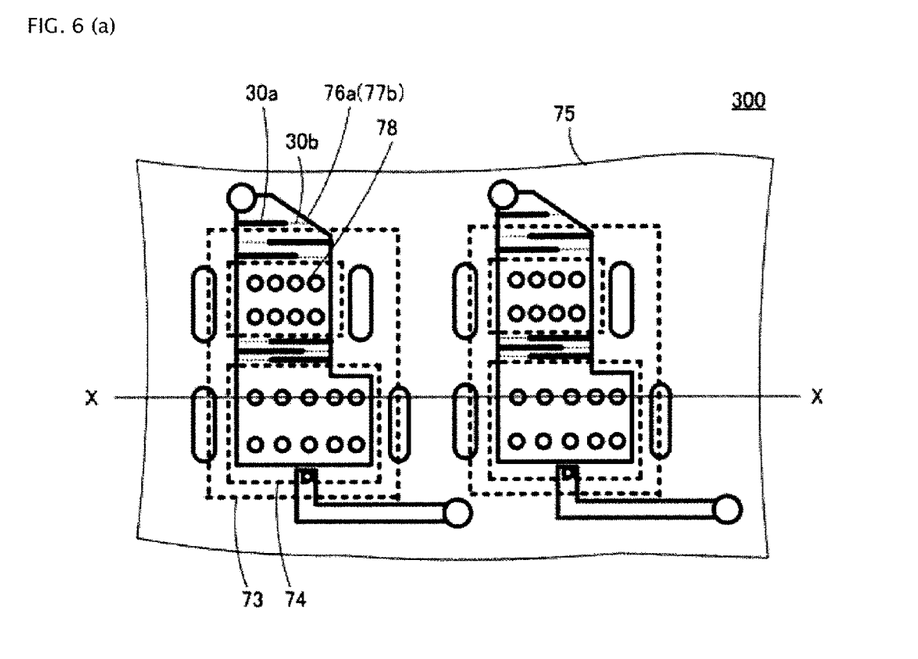
FIG. 6(a) is a substantial plan view.
FIG. 6(b) is a substantial cross-sectional view taken along line X-X of FIG. 6(a)

FIGS. 6(a) and 6(b) are a configuration diagram showing an internal wiring structure of a power semiconductor device according to a third example of the present invention. FIG. 6(a) is a substantial plan view, and FIG. 6(b) is a substantial cross-sectional view taken along line X-X of FIG. 6(a). In this example, an internal wiring structure of a power semiconductor module is illustrated as the internal wiring structure of the power semiconductor device.

Figure 7:
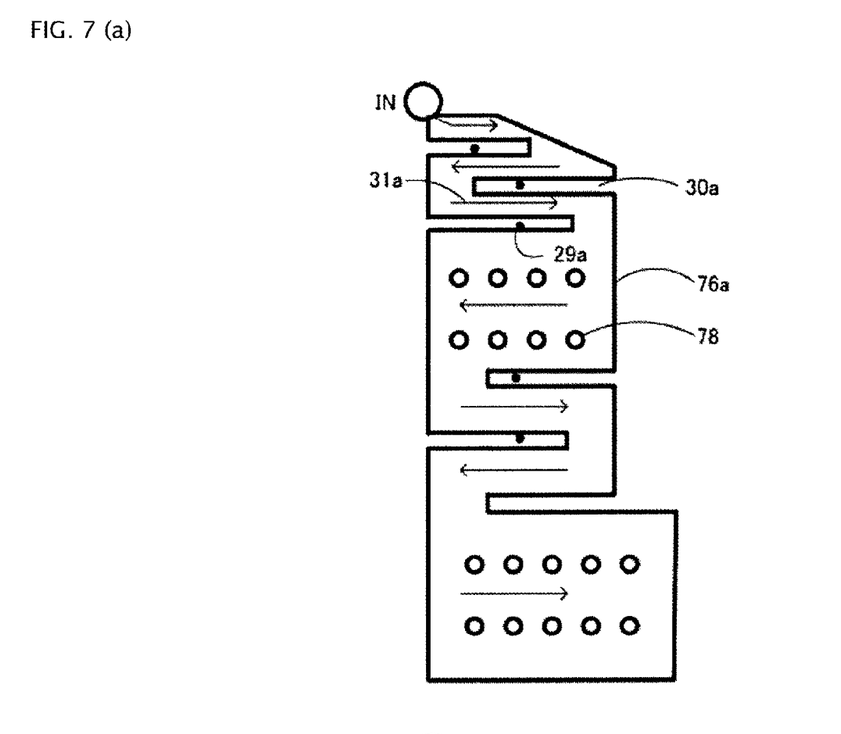
FIG. 7(a) is a substantial plan view of a first wiring conductor.
FIG. 7(b) is a substantial plan view of a second wiring conductor.

FIGS. 7(a) and 7(b) are a configuration diagram of a wiring conductor of FIGS. 6(a) and 6(b). FIG. 7(a) is a substantial plan view of a first wiring conductor 76a, and FIG. 7(b) a substantial plan view of a second wiring conductor 77a. The difference between the power semiconductor device 200 and a power semiconductor module 600 of FIG. 10 is that the wiring conductors 76, 77 are changed to the first and second wiring conductors 76a, 77a. Note that the same reference numerals are used on the sections same as those of the configuration shown in FIG. 10.

In a power semiconductor device 300, the rear conductive film 72, which is a metal foil, is formed on the first main surface of the insulating plate 71, and at least one conductive pattern 73 made from another metal foil is formed on the second main surface of the insulating plate 71. The power semiconductor device 300 also has the printed board 75 that is disposed so as to face a semiconductor chip 74, which is a semiconductor element bonded onto the other metal foil, and so as to face a main surface of the insulating plate 71 in which the semiconductor chip 74 is disposed. The first wiring conductor 76a made of a metal foil, which has a first main surface (front side) with the printed board 75, the second wiring conductor 77a made of another metal foil, which has a second main surface (rear side) with the printed board 75, and a main electrode of the semiconductor chip 74, are electrically connected to one another by a plurality of post electrodes 78 (post pins). By connecting the two wiring conductors 76a, 77a to the post electrodes, high reliability can be obtained as described above. The wiring conductors 76a, 77a are connected to, for example, an external connection terminal at a section indicated by reference numeral "IN."

In this configuration, the first wiring conductor 76a is obtained by forming notches 30a alternately from opposing side walls on the metal foil disposed on the front side of the printed board 75. Furthermore, the second wiring conductor 77a is obtained by forming notches 30b alternately from opposing side walls on the metal foil disposed on the rear side of the printed board 75. Not only a well-known printed board but also a resin film of polyimide or the like can be used as the printed board 75. The notches 30a, 30b stretch farther back past central points 29a, 29b between the side walls opposing each other. The first wiring conductor 76a and the second wiring conductor 77a are disposed such that the notches 30a and the notches 30b overlap with each other and the central points 29a, 29b overlap with each other.

Currents enter from IN via, for example, the external connection terminal, which is not shown, and flow to the conductive pattern 73 via the semiconductor ship 74. By forming the notches 30a, 30b, the currents flowing through the first wiring conductor 76a and the second wiring conductor 77a flow as currents 31a, 31b to flow in a meandering fashion (to flow along the notches 30a, 30b). The currents 31a, 31b flow in a meandering fashion in directions opposite to each other. Therefore, the mutual inductance between the first wiring conductor 76a and the second wiring conductor 77a can be reduced.

The shapes of the first wiring conductor 76a and the second wiring conductor 77a of the present example are different from each other. However, the wiring conductors of the first and second examples are the same in that the belt-like conductors thereof have sections that are bent into U-shapes. The bent sections of the first wiring conductor 76a and the second wiring conductor 77a have paths in which the currents flow in directions opposite to each other, contributing to a decrease in the mutual inductance.

The foregoing merely illustrates the principles of the present invention. A person skilled in the art can make a large number of modifications and changes. The present invention is not intended to be limited to the accurate configurations and applications described above, but is intended to cover all relevant modifications and equivalents as the accompanying claims and equivalents of the present invention.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

What is claimed is:

1. An internal wiring structure of a semiconductor device that has a first wiring conductor and a second wiring conductor that are disposed so as to oppose each other and in parallel to each other in a case and have currents flowing in the same direction from an input part to an output part, wherein:
   the first wiring conductor and the second wiring conductor are formed from flat plates;
   in the first wiring conductor, first notches are formed alternately along a plurality of straight lines extending parallel from one of opposing side walls to the other side wall, in such a manner as to stretch, beyond first central points between the side walls, from one of the side walls to the other side wall and vice versa;
   in the second wiring conductor, second notches are formed alternately immediately below the plurality of straight lines, in such a manner as to stretch, beyond second central points between side walls, from one of the side walls to the other side wall and vice versa, the one side wall being positioned on a side opposite to the side wall having the first notches; and
   a length of the first notches is equal to that of the second notches formed immediately below the first notches, the first central points and the second central points overlap with each other, the first notches and the second notches partially overlap with each other, a direction of the current flowing through the first wiring conductor along the first notches is opposite to a direction of the current flowing through the second wiring conductor along the second notches, and a mutual inductance between the first wiring conductor and the second wiring inductor is thereby reduced.

2. The internal wiring structure of a semiconductor device according to claim 1, wherein the first wiring conductor and the second wiring conductor are formed on a front side and rear side of an insulating plate, respectively.

3. The internal wiring structure of a semiconductor device according to claim 1, wherein the first notches are formed at equal intervals, and a space between a bottom end part of the first notches and a side wall of the first wiring conductor that faces the bottom end part is equal to the interval of the first notches.

4. A wiring structure of a semiconductor device comprising:
   a first wiring conductor and a second wiring conductor disposed so as to oppose each other and in parallel to each other, in a case, and that have currents flowing in the same direction from an input part to an output part, wherein:
   the first wiring conductor and the second wiring conductor are formed from flat plates;
   in the first wiring conductor, first notches are formed alternately along a plurality of straight lines extending parallel from one of opposing side walls to the other side wall, in such a manner as to stretch, beyond first central points between the side walls, from one of the side walls to the other side wall and vice versa;
   in the second wiring conductor, second notches are formed alternately immediately below the plurality of straight lines, in such a manner as to stretch, beyond second central points between side walls, from one of the side walls to the other side wall and vice versa, the one side wall being positioned on a side opposite to the side wall having the first notches; and
   a length of the first notches is equal to that of the second notches formed immediately below the first notches, the first central points and the second central points overlap with each other, the first notches and the second notches partially overlap with each other, a direction of the current flowing through the first wiring conductor along the first notches is opposite to a direction of the current flowing through the second wiring conductor along the second notches, and a mutual inductance between the first wiring conductor and the second wiring inductor is thereby reduced.

* * * * *